(12) United States Patent
Hur et al.

(10) Patent No.: US 11,744,068 B2
(45) Date of Patent: Aug. 29, 2023

(54) THREE-DIMENSIONAL SEMICONDUCTOR MEMORY DEVICE INCLUDING SLIT STRUCTURES

(71) Applicant: SK hynix Inc., Icheon-si (KR)

(72) Inventors: Min Jae Hur, Icheon-si (KR); Ji Hyeun Shin, Icheon-si (KR); Ju Hun Kim, Icheon-si (KR); Bo Ram Park, Icheon-si (KR); Ji Woong Sue, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 314 days.

(21) Appl. No.: 17/023,168

(22) Filed: Sep. 16, 2020

(65) Prior Publication Data

US 2021/0366925 A1    Nov. 25, 2021

(30) Foreign Application Priority Data

May 19, 2020    (KR) .......................... 10-2020-0059681

(51) Int. Cl.
*H10B 43/27* (2023.01)
*H10B 43/10* (2023.01)
*G11C 16/08* (2006.01)
*H10B 43/35* (2023.01)

(52) U.S. Cl.
CPC ............ *H10B 43/27* (2023.02); *G11C 16/08* (2013.01); *H10B 43/10* (2023.02); *H10B 43/35* (2023.02)

(58) Field of Classification Search
CPC ....... H01L 27/115–11597; G11C 16/08; G11C 16/0843; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| 2015/0084204 A1* | 3/2015 | Yun ................... H01L 21/76807 438/618 |
| 2019/0027490 A1* | 1/2019 | Shin .................. H01L 27/11526 |
| 2019/0333924 A1 | 10/2019 | Greenlee et al. |
| 2020/0020714 A1 | 1/2020 | Oh |
| 2021/0111181 A1* | 4/2021 | Lee ................... H01L 27/11556 |

(Continued)

FOREIGN PATENT DOCUMENTS

KR    1020140137632 A    12/2014

*Primary Examiner* — Didarul A Mazumder
*Assistant Examiner* — Gustavo G Ramallo
(74) *Attorney, Agent, or Firm* — WILLIAM PARK & ASSOCIATES LTD.

(57) ABSTRACT

A semiconductor memory device includes a stack structure and a slit structure. The stack structure includes insulation layers and conductive layers alternately stacked with the insulation layers. The slit structure is configured to divide the stack structure into memory blocks. A part of the slit structure configured to define one memory block has a dashed shape including a slit region and a bridge region.

15 Claims, 24 Drawing Sheets

(56) References Cited

U.S. PATENT DOCUMENTS

| | | | |
|---|---|---|---|
| 2022/0005767 A1* | 1/2022 | Itai | H01L 27/11529 |
| 2022/0005822 A1* | 1/2022 | Manthena | H01L 27/11529 |
| 2022/0028885 A1* | 1/2022 | Kim | H01L 27/11582 |

* cited by examiner

THREE-DIMENSIONAL SEMICONDUCTOR MEMORY DEVICE INCLUDING SLIT STRUCTURES

CROSS-REFERENCES TO RELATED APPLICATION

The present application claims priority under 35 U.S.C. § 119(a) to Korean application number 10-2020-0059681, filed on May 19, 2020, in the Korean Intellectual Property Office, which is incorporated herein by reference in its entirety.

BACKGROUND

1. Technical Field

Various embodiments generally relate to a three-dimensional semiconductor memory device, and more particularly, to a slit structure configured to divide blocks of a non-volatile memory device.

2. Related Art

In order to provide a semiconductor memory device having good performance at a low price, it may be required to increase an integration degree of the semiconductor memory device. The integration degree of a semiconductor memory device is an important factor for determining the cost of a product including the semiconductor memory device.

In a two-dimensional or planar semiconductor memory device, an integration degree of the two-dimensional or planar semiconductor memory device may be determined by an area of a unit memory cell so that the integration degree may be so affected by a technology for forming a fine pattern. However, because the fine pattern may be formed using high-priced equipment, the integration degree of the two-dimensional semiconductor memory device may be restricted, although slightly increased. In order to overcome this restriction, three-dimensional semiconductor memory devices including three-dimensionally arranged memory cells may be considered. Further, in order to increase an integration density, stacked numbers of the three-dimensional semiconductor memory devices may be increased. Thus, when a slit is formed to divide blocks of the semiconductor memory device, a shape of a block structure may be changed due to a high aspect ratio.

SUMMARY

Some embodiments are directed to a three-dimensional semiconductor memory device that may be capable of conserving a shape of a memory block.

In example embodiments of the present disclosure, a semiconductor memory device may include a stack structure and a slit structure. The stack structure may include insulation layers and conductive layers alternately stacked with the insulation layers. The slit structure may be configured to divide the stack structure into memory blocks. A part of the slit structure is configured to define one memory block, and to have a dashed shape including a slit region and a bridge region.

In example embodiments of the present disclosure, a semiconductor memory device may include a plurality of memory blocks. Each of the memory blocks may include a line structure. The memory blocks may be divided by a slit structure. The line structure of any one among the plurality of memory blocks may be electrically connected with one line structure of a selected memory block among the plurality of memory blocks via at least one bridge region.

In example embodiments, the memory block may include a cell array region and a slimming region. The slimming region may include a plurality of contact regions. The contact regions to may be positioned at both sides of the cell array region. The contact regions may be configured to make contact with an electrical signal line.

In example embodiments, the bridge region may be formed in the cell array region and the slimming region. Alternatively, the bridge region may be formed only in the slimming region.

In example embodiments of the present disclosure, a semiconductor memory device may include a plurality of memory blocks. The memory blocks may be divided by a slit structure. The slit structure may include first and second slit portions, and third and fourth slit portions. The first and second slit portions may extend in a first direction. The first and second slit portions may be alternately arranged parallel to each other. The third and fourth slit portions may extend in a second direction substantially perpendicular to the first direction. The third and fourth slit portions may be alternately arranged parallel to each other. The third slit portion may be connected between first ends of the first and second slit portions. The fourth slit portion may be connected between second ends of the first and second slit portions. The first slit portion may have a slit region. The second slit portion may have a dashed shape including the slit region and at least one bridge region.

In example embodiments of the present disclosure, a semiconductor memory device may include a memory block and a slit structure. The memory block may include a cell array region and a slimming region. The slimming region may include a plurality of contact regions. The memory block may be divided by the slit structure. The contact regions may be arranged in a stepped shape along the first and second directions in the slimming region to divide the slimming region into a high stepped region and a low stepped region with respect to the second direction. The slit structure may include a first slit portion configured to divide a portion including the high stepped region, and a second slit portion configured to divide a portion including the low stepped region. The second slit portion may include the slit region and a bridge region.

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, presented embodiments of the present teachings should not be construed as limiting the present teachings. Although a few embodiments of the present teachings will be shown and described, it will be appreciated by those of ordinary skill in the art that changes may be made in these embodiments without departing from the principles and spirit of the present teachings.

Figure 1:
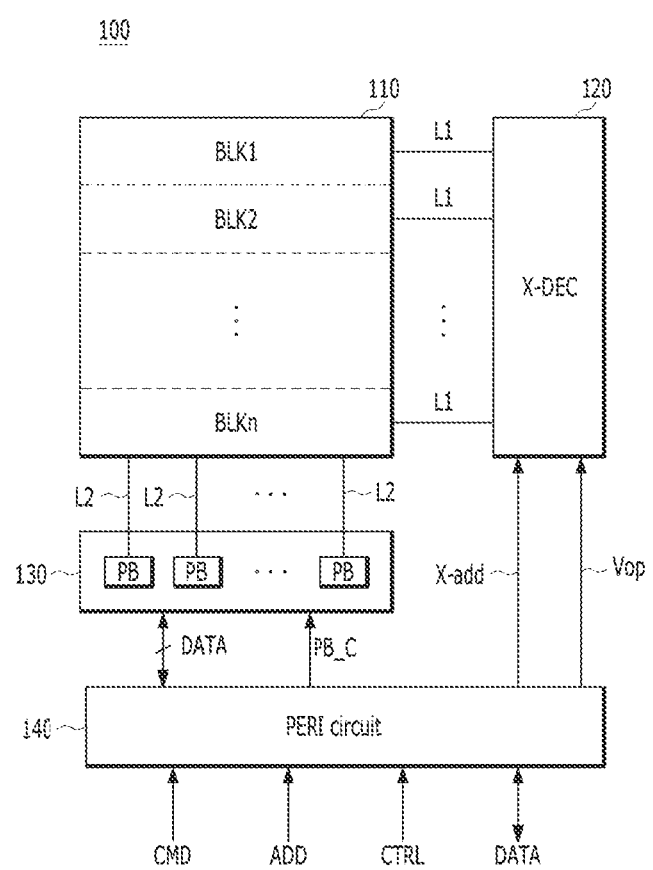
FIG. 1 is a block diagram illustrating a non-volatile memory device in accordance with example embodiments.

FIG. 1 is a block diagram illustrating a non-volatile memory device in accordance with example embodiments.

Referring to FIG. 1, a non-volatile memory device 100 of example embodiments may include a memory cell array 110, a row decoder 120, a page buffer circuit 130, and a peripheral circuit 140.

The memory cell array 110 may include a plurality of memory blocks BLK1~BLKn. Although not depicted in FIG. 1, each of the memory blocks BLK1~BLKn may include a plurality of memory cells. The memory cells may be accessed by a word line and a bit line. The memory cells may include non-volatile memory cells configured to maintain stored data in the absence of supplied power. However, the memory cells are not restricted to be non-volatile memory cells.

Further, hereinafter, the non-volatile memory device may include a vertical NAND flash device, not restricted to be of a specific kind.

The memory cell array 110 may include a plurality of first line structures L1 and a plurality of second line structures L2 configured to define the memory cells. The first line structures L1 may include the word lines. The second line structures L2 may include the bit lines intersected with the first line structures L1. In example embodiments, each of the memory blocks BLK1~BLKn may include one first line structure L1.

The first line structure L1 may extend to the row decoder 120. The first line structure L1 may be electrically connected to the row decoder 120. Each of the first line structures L1 may include at least one drain selection line, a plurality of word lines, and at least one source selection line. For example, one first line structure L1 may form one memory block BLK. The row decoder 120 may select any one of the memory blocks BLK1~BLKn of the memory cell array 110 in accordance with address information. The row decoder 120 may transmit an operational voltage Vop to a selected memory block through the first line structure L1. For example, the operational voltage Vop may include a program voltage, a pass voltage, and a read voltage. The operational voltage Vop may be received from the peripheral circuit 140. Although not depicted in the drawings, in order to selectively provide the selected memory blocks BLK1~BLKn with the operational voltage Vop, the row decoder 120 may include a pass switch element.

The page buffer circuit 130 may be electrically connected with the second line structure L2. The page buffer circuit 130 may include a plurality of page buffers PB connected to each of the second line structures L2. The page buffer circuit 130 may receive a page buffer control signal PB_C from the peripheral circuit 140. Data may be transmitted between the page buffer circuit 130 and the peripheral circuit 140.

The page buffer circuit 130 may control the second line structure L2 connected to the memory cell array 110, i.e., the bit line in response to the page buffer control signal PB_C. For example, the page buffer circuit 130 may sense a voltage level of the bit line in the memory cell array 110 in response to the page buffer control signal PB_C to detect the data in the memory cell. The page buffer circuit 130 may transmit the detected data to the peripheral circuit 140. The page buffer circuit 130 may apply a voltage, which may correspond to the data, to the bit line based on the page buffer control signal PB_C and the data to perform a program operation. The page buffer circuit 130 may program data in the memory cell connected to the word line, which may be activated by the row decoder 120, or read the data in the memory cell.

The peripheral circuit 140 may receive a command signal CMD, an address signal ADD, and a control signal CTRL from an external device of the semiconductor memory device 100, for example, a controller. The data may be transmitted between the peripheral circuit 140 and the controller. The peripheral circuit 140 may program the data in the selected memory cell of the memory cell array based on the command signal CMD, the address signal ADD, and the control signal CTRL. The peripheral circuit 140 may output signals for reading the data in the memory cell, for example, a row address signal X-add, the page buffer control signal PB_C, etc. The peripheral circuit 140 may generate various voltages required in the semiconductor memory device 100, for example, the operational voltage Vop.

Figure 2:
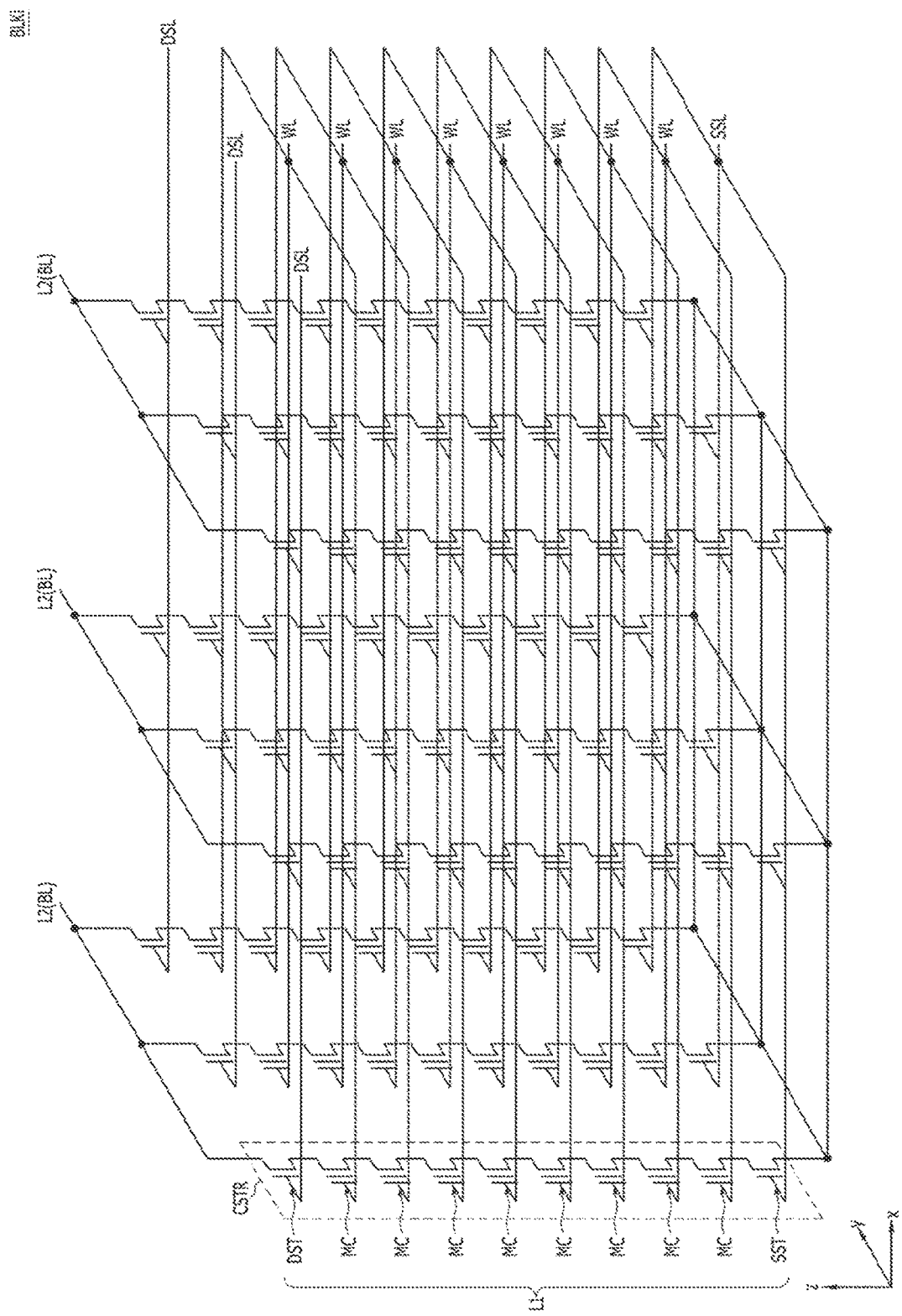
FIG. 2 is an equivalent circuit diagram illustrating a memory block in accordance with example embodiments.

FIG. 2 is an equivalent circuit diagram illustrating a memory block in accordance with example embodiments.

Referring to FIG. 2, a memory block BLKi may include the second line structures L2, i.e., bit lines BL, and a plurality of cell strings CSTR connected between bit lines BL and a common source line CSL.

The second line structures L2 may extend parallel to each other in a y-direction. The cell strings CSTR may be connected in parallel between the second line structures L2 and the common source line CSL.

Each of the cell strings CSTR may include a drain selection transistor DST connected to the second line structure L2, i.e., the bit line BL, a source selection transistor SST connected to the common source line CSL, and a plurality of memory cells MC connected between the drain selection transistor DST and the source selection transistor SST. The drain selection transistor DST, the memory cells MC, and the source selection transistor SST may be connected in series with each other in a z-direction.

Drain selection lines DSL, a plurality of word lines WL, and a source selection line SSL may be stacked in a space between the second line structure L2 and the common source line CSL. The drain selection lines DSL, the word lines WL, and the source selection line SSL may extend in an x-direction. The drain selection lines DSL may be connected to a gate of each of the corresponding drain selection transistors DST. The word lines WL may be connected to a gate of each of the corresponding memory cells MC. The source selection line SSL may be connected to a gate of each of the corresponding source selection transistors SST.

Figure 3:
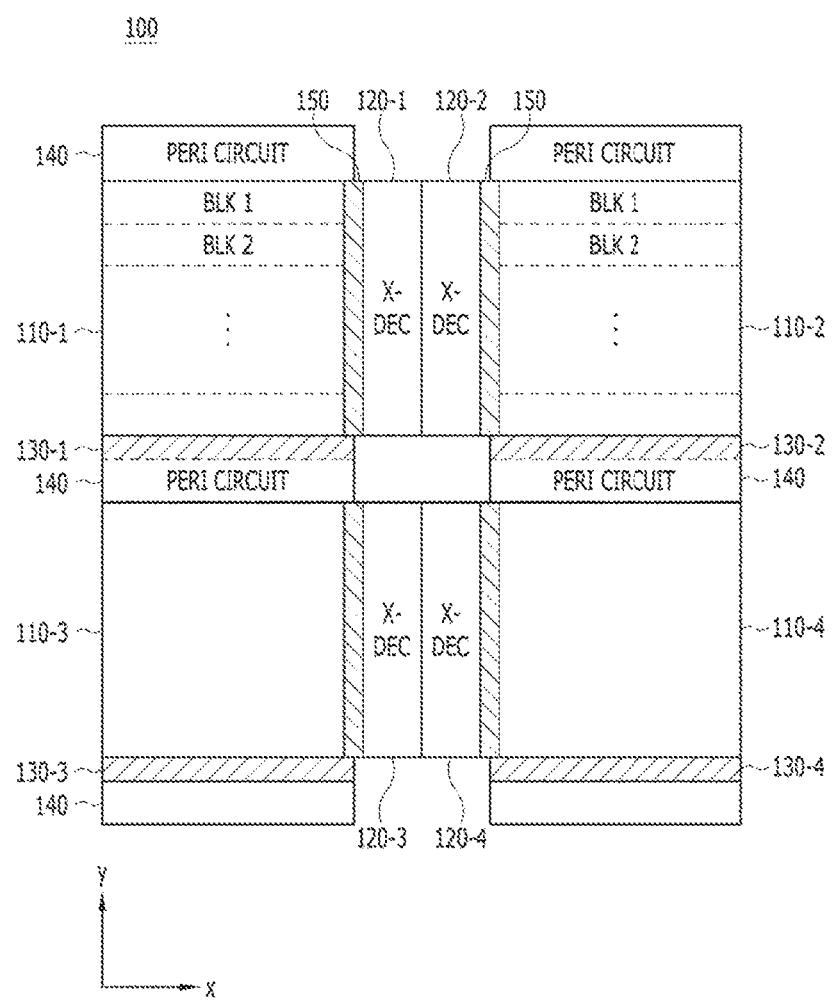
FIG. 3 is a plan view illustrating a semiconductor memory device in accordance with example embodiments.

FIG. 3 is a plan view illustrating a semiconductor memory device in accordance with example embodiments.

Referring to FIG. 3, four memory cell arrays 110-1~110-4 may be arranged on a semiconductor substrate in a matrix shape along the x-direction and the y-direction. The memory cell arrays 110-1~110-4 may correspond to a plane of the non-volatile memory device.

The row decoders 120-1~120-4 may be arranged at a first edge portion of the memory cell arrays 110-1~110-4. For example, the row decoders 120-1~120-4 may be arranged at the first edge portion among edge portions of the memory cell arrays 110-1~110-4 parallel to the y-direction.

The page buffer circuits 130-1~130-4 may be arranged at a second edge portion of the memory cell arrays 110-1~110-4 adjacent to the first edge portion. For example, the page buffer circuits 130-1~130-4 may be arranged at the second edge portion among the edge portions of the memory cell arrays 110-1~110-4 parallel to the x-direction.

The peripheral circuit 140 may be dispersedly arranged between the memory cell arrays 110-1~110-4. FIG. 3 shows the memory cell arrays 110-1~110-4, the row decoders 120-1~120-4, the page buffer circuits 130-1~130-4, and the peripheral circuit 140 on a same plane. However, the memory cell arrays 110-1~110-4, the row decoders 120-1~120-4, the page buffer circuits 130-1~130-4, and the peripheral circuit 140 may be positioned on different planes on a surface of the semiconductor substrate.

The first line structure L1 of the memory cell arrays 110-1~110-4 may be electrically connected to the row decoders 120-1~120-4, particularly, a pass transistor (not shown) of the row decoder 120-1. In order to effectively connect conductive lines of the first line structure L1 with the pass transistor, it may be required to slim the first line structure L1.

For example, the first line structure L1 in one memory block BLKi may include the source selection line SSL, the word lines WL, and the drain selection line DSL sequentially stacked. In order to supply an electrical signal to the source selection line SSL, the word lines WL and the drain selection line DSL from the pass transistor, the slimming process may be performed to provide the source selection line SSL, the word lines WL, and the drain selection line DSL with different extension lengths. Portions of the source selection line SSL, the word lines WL, and the drain selection line DSL having the different extension lengths may be referred to as a slimming region 150.

As an integration degree of the semiconductor memory device may have been increased, numbers of the memory cells on one memory block BLKi may be greatly increased. Thus, numbers of the word lines WL in the first line structure L1 may also be remarkably increased. Therefore, it is difficult to form contact regions for providing voltage to the source selection line SSL, the word lines WL, and the drain selection line DSL in the defined slimming region 150.

Recently, a part of widths of the conductive layers SSL, WL, and DSL in the first line structure L1 may be used for the contact regions.

Figure 4:
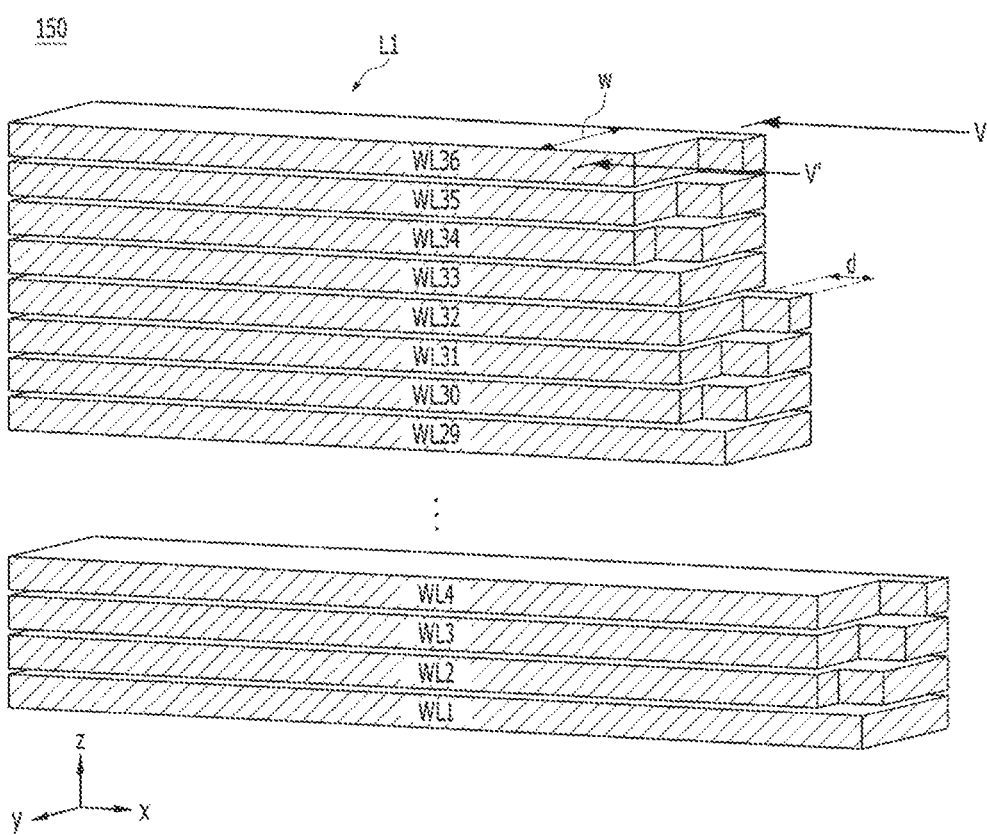
FIG. 4 is a perspective view illustrating an arrangement of word lines in a slimming region in accordance with example embodiments.
Figure 5:
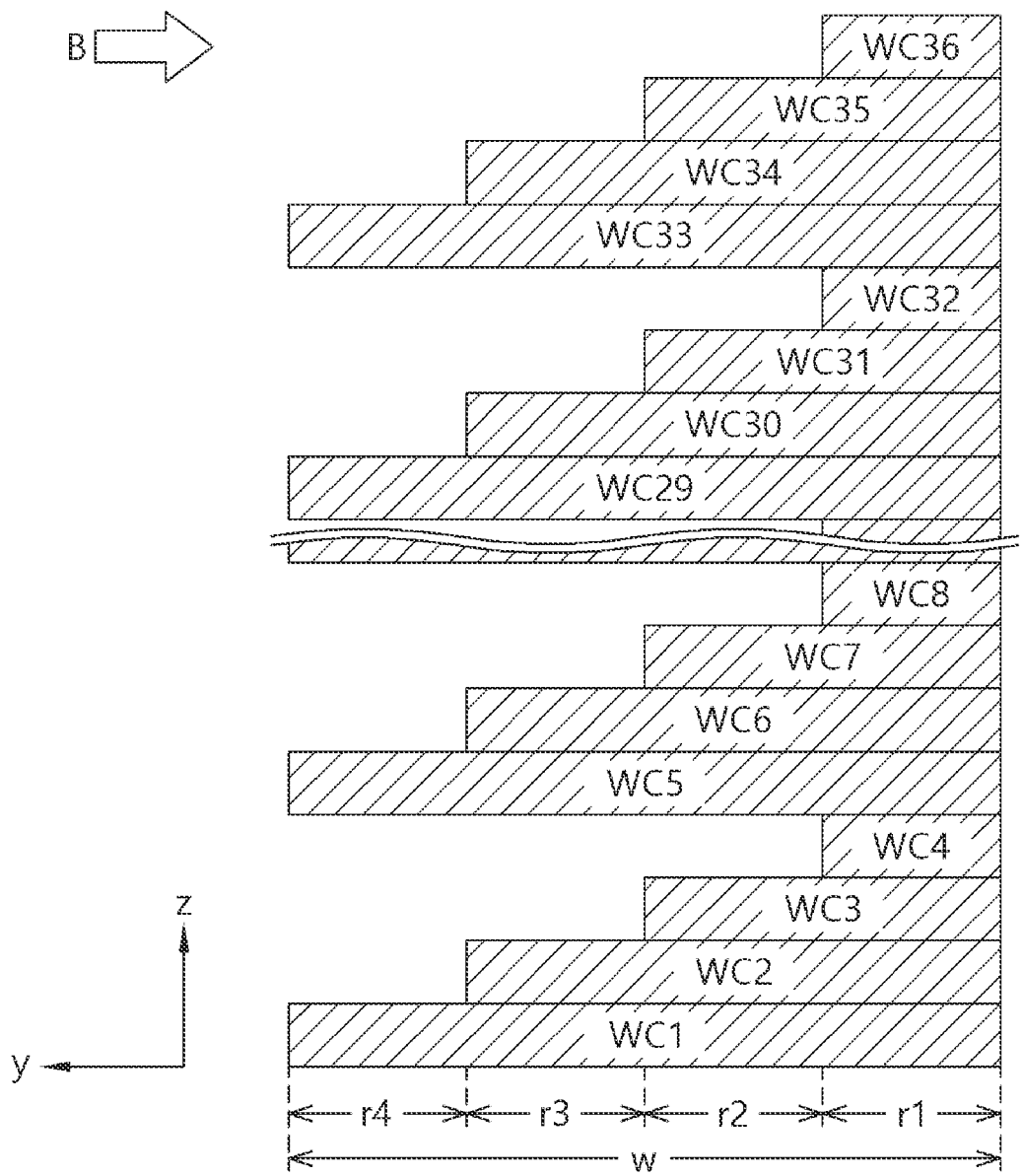
FIG. 5 is a cross-sectional view taken along a line V-V' in FIG. 4.
Figure 6:
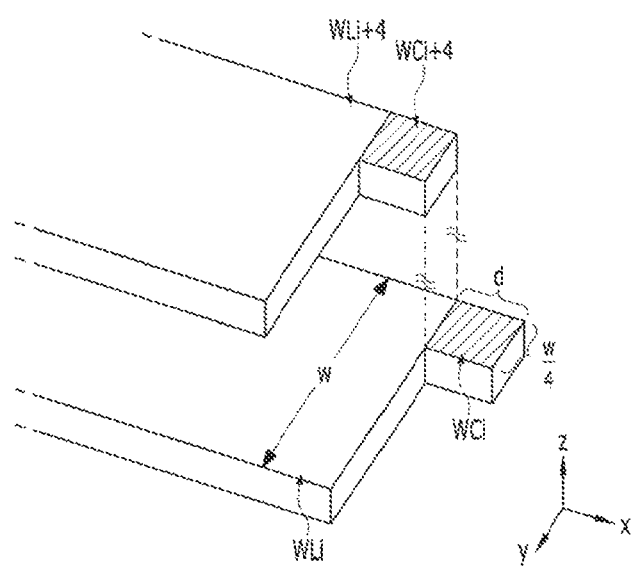
FIG. 6 is a perspective view illustrating adjacent word lines in a first stepped region along a z-direction in accordance with example embodiments.

FIG. 4 is a perspective view illustrating an arrangement of word lines in a slimming region in accordance with example embodiments, FIG. 5 is a cross-sectional view taken along a line V-V' in FIG. 4, and FIG. 6 is a perspective view illustrating adjacent word lines in a first stepped region along a z-direction in accordance with example embodiments.

For convenience of explanation, word lines WL1~WL36 among conductive lines in the first line structure may be illustrated. Further, FIGS. 4 to 6 show an arrangement of the word lines in a unit memory block divided by a slit.

Referring to FIGS. 4 to 6, the word lines WL1~WL36 in the first line structure L1 may be sequentially stacked in the z-direction. The word lines WL1~WL36 in the slimming region 150 may have a changed length and a changed width for electrically contacting the word lines WL1~WL36 with the row decoders 120-1~120-4 to form word line contact regions WC1~WC36.

For example, the word lines WL1~WL36 in the slimming region 150 may be divided into four classes (layers) such that each class has a same length and different widths, i.e., the word line contact region. However, the word lines WL1~WL36 in the memory cell array 110-1~110-4 may include the same width and the same length.

For example, the thirty-sixth to thirty-third word lines WL36~WL33 may have substantially the same length in the x-direction of the slimming region 150. An original width of the thirty-sixth word line WL36 in the slimming region 150 may be slimmed to provide the thirty-sixth word line WL36 with a width of about ¼ times the original width. An original width of the thirty-fifth word line WL35 in the slimming region 150 may be slimmed to provide the thirty-fifth word line WL35 with a width of about ⅔ times the original width. An original width of the thirty-fourth word line WL34 in the slimming region 150 may be slimmed to provide the thirty-fourth word line WL34 with a width of about ¾ times the original width. The thirty-third word line WL33 may have an original width. Because the upper word line in the slimming region 150 may have the reduced width, a portion of the lower word line in the slimming region 150, which may have an area of about ¼ times an original area of the lower word line, may be exposed. As a result, the word line contact regions WC36~WC33 may have a width of about ¼ times the original width of the word lines. Thus, the word lines WL1~WL36 may be divided into first to fourth stepped regions r1~r4 viewed from the V-V' direction in FIG. 4.

Further, the thirty-second to twenty-ninth word lines WL32~WL29 may have a length by 'd' longer than a length of the thirty-sixth to thirty-third word lines WL36~WL33. In the slimming region 150, the thirty-second to twenty-ninth word lines WL32~WL29 may form word line contact regions WC32~WC29 in a rule substantially the same as the rule of the thirty-sixth to thirty-third word lines WL36~WL33 for forming the word line contact regions WC36~WC33. Thus, the remaining word lines WL28~WL1 and the remaining word line contact regions WC28~WC1 may be arranged in the rule. Therefore, the first line structure L1 including the stacked word lines WL1~WL36 in the slimming region 150 may have the stepped structure along the lengthwise and breadthwise directions of the word lines, i.e., the x and y directions.

The word line contact regions of example embodiments may have a structure different from the above-indicated structure.

Figure 7:
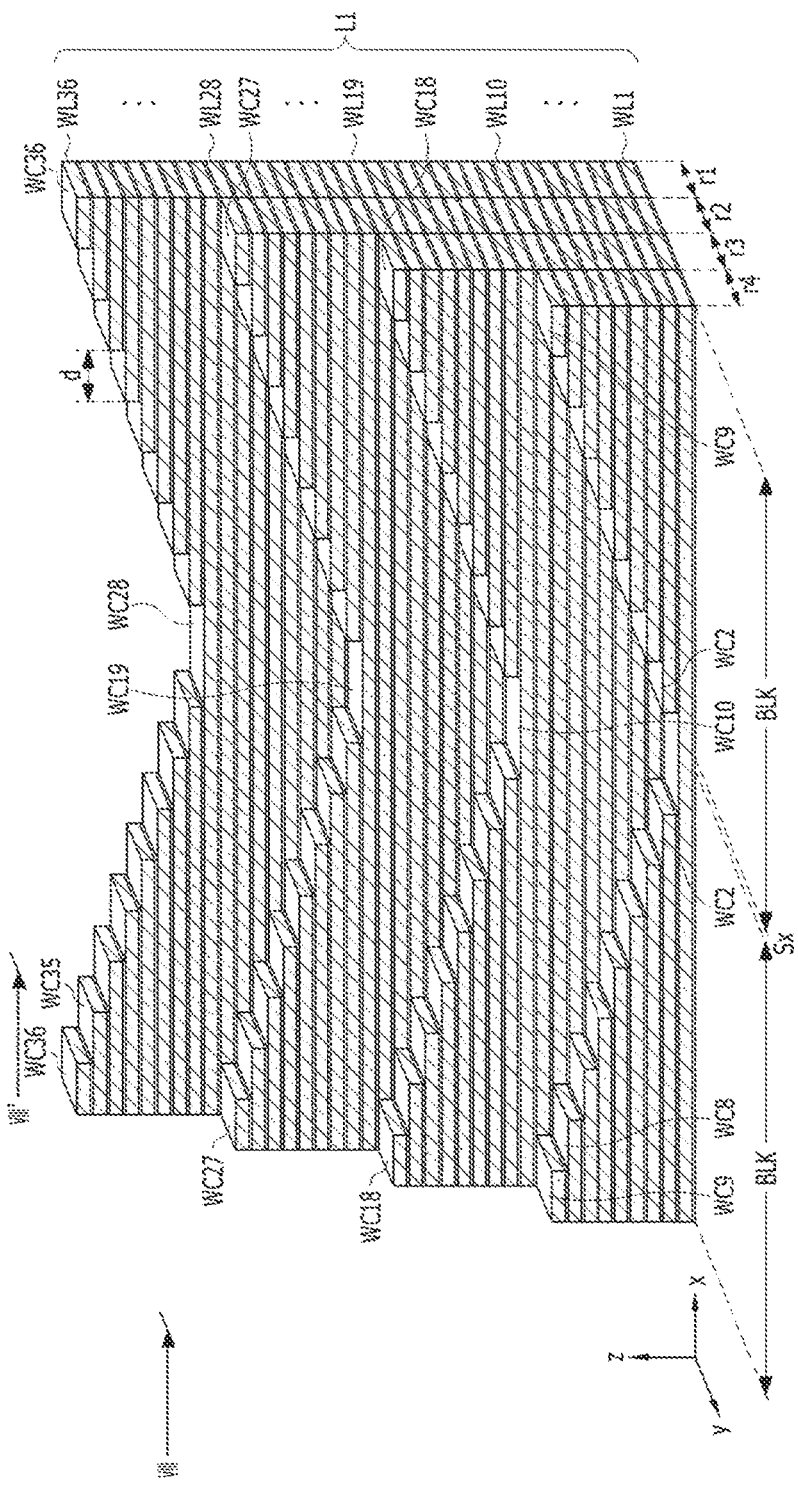
FIG. 7 is a perspective view illustrating a first line structure of a slimming region in accordance with example embodiments.
Figure 8:
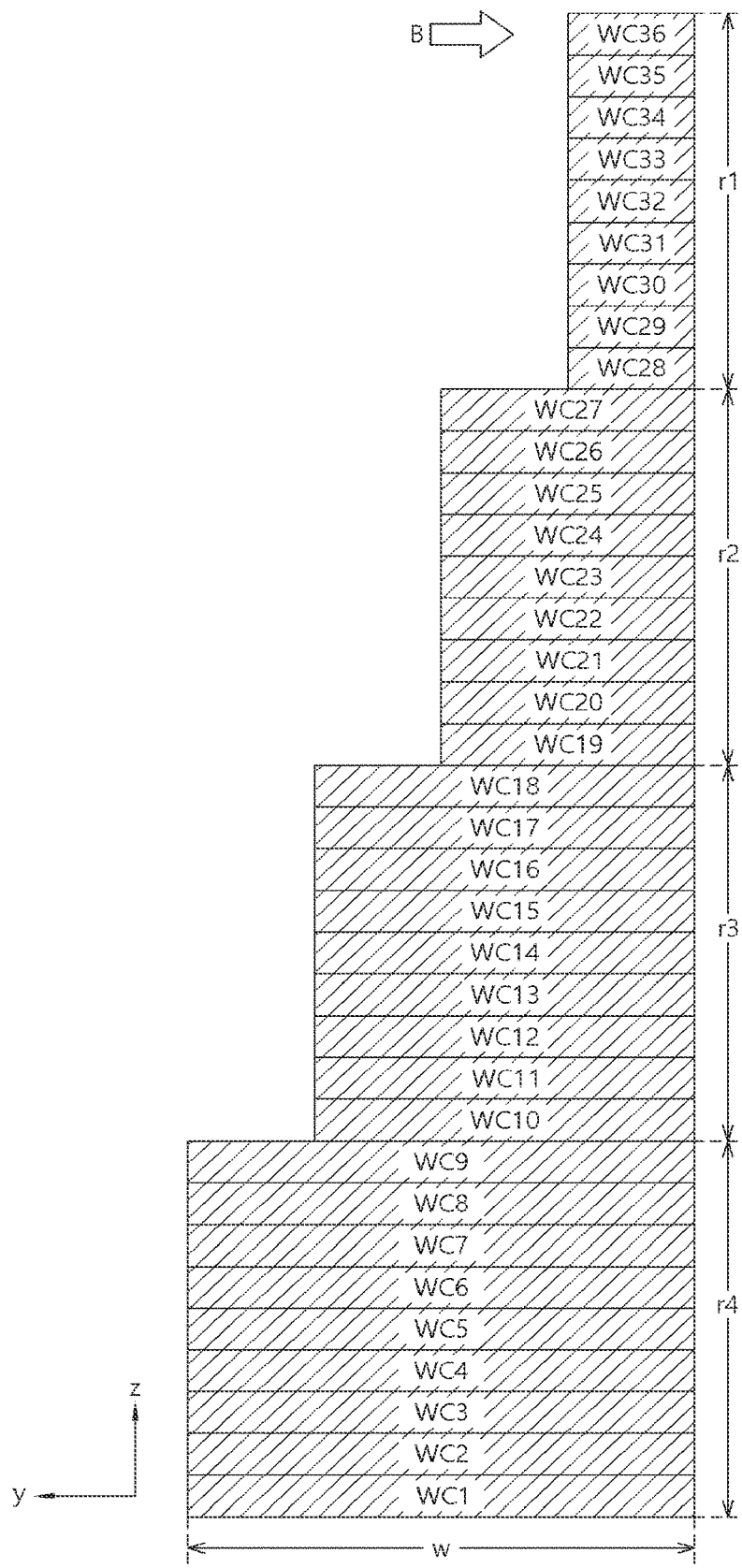
FIG. 8 is a cross-sectional view taken along a line VII-VII' in FIG. 7.

FIG. 7 is a perspective view illustrating a first line structure of a slimming region in accordance with example embodiments, and FIG. 8 is a cross-sectional view taken along a line VII-VII' in FIG. 7.

FIG. 7 shows word line contact regions WC1~WC36 of two adjacent memory blocks BLK before being divided into the memory blocks by a slit Sx. Further, in FIGS. 7 and 8, an insulation layer may be interposed between the word line contact regions WC1~WC36.

Referring to FIGS. 7 and 8, the word lines WL1~WL36 in the first line structure L1 may be divided into four stepped regions r1, r2, r3, and r4 to control lengths and widths of the word lines WL1~WL36. Each of stepped regions r1, r2, r3 and r4 includes 9 word lines.

For example, the thirty-sixth to twenty-eighth word lines WL36~WL28 in the slimming region 150 may be slimmed to provide the thirty-sixth to twenty-eighth word lines WL36~WL28 with a width of about ¼ times an original width of the thirty-sixth to twenty-eighth word lines WL36~WL28. Thus, the thirty-sixth to twenty-eighth word lines WL36~WL28 may define the thirty-sixth to twenty-eighth word line contact regions WC36~WC28 in a first stepped region r1. The thirty-sixth to twenty-eighth word lines to WL36~WL28 in the first stepped region r1 may have gradually increasing lengths by a length d from an upper portion to a lower portion in the thirty-sixth to twenty-eighth word lines WL36~WL28.

The twenty-seventh to nineteenth word lines WL27~WL19 in the slimming region 150 may be slimmed to provide the twenty-seventh to nineteenth word lines WL27~WL19 with a width of about ⅔ times an original width of the twenty-seventh to nineteenth word lines WL27~WL19. Thus, the twenty-seventh to nineteenth word lines WL27~WL19 thirty-sixth may define the twenty-seventh to nineteenth word line contact regions WC27~WC19 in a second stepped region r2. The twenty-seventh to nineteenth word lines WL27~WL19 in the first and second stepped regions r1 and r2 of the slimming region 150 may have gradually increasing lengths by a length d from an upper portion to a lower portion in the twenty-seventh to nineteenth word lines WL27~WL19.

The eighteenth to tenth word lines WL18~WL10 in the slimming region 150 may be slimmed to provide the eighteenth to tenth word lines WL18~WL10 with a width of about ¾ times an original width of the eighteenth to tenth word lines WL18~WL10. Thus, the eighteenth to tenth word lines WL18~WL10 may define the eighteenth to tenth word line contact regions WC18~WC10 in a third stepped region r3. The eighteenth to tenth word lines WL18~WL10 in the first to third stepped regions r1, r2, and r3 of the slimming region 150 may have gradually increasing lengths by a length d from an upper portion to a lower portion in the eighteenth to tenth word lines to WL18~WL10.

The ninth to first word lines WL9~WL1 may have an original width. The ninth to first word lines WL9~WL1 may define the ninth to first word line contact regions WC9~WC1 in the fourth stepped region r4 by the tenth to thirty-sixth contact regions WC10~WC36 over the ninth to first word lines WL9~WL1. The ninth to first word lines WL9~WL1 in the first to fourth stepped regions r1, r2, r3, and r4 of the slimming region 150 may have gradually increasing lengths by a length d from an upper portion to a lower portion in the ninth to first word lines WL9~WL1.

This structure may also have the relatively high stepped portions between the first to fourth stepped regions r1, r2, r3, and r4 of the first line structure L1.

Figure 9:
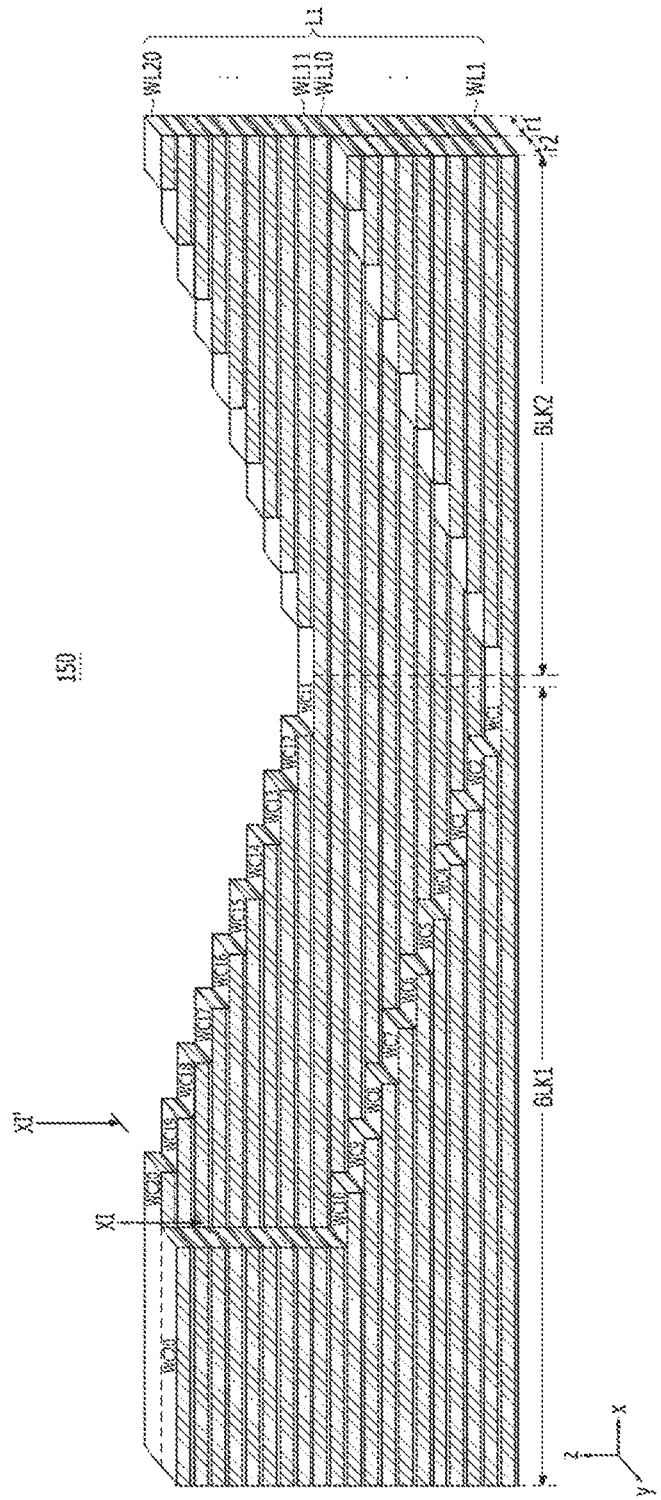
FIG. 9 is a perspective view illustrating a first line structure of a slimming region in accordance with example embodiments.
Figure 10:
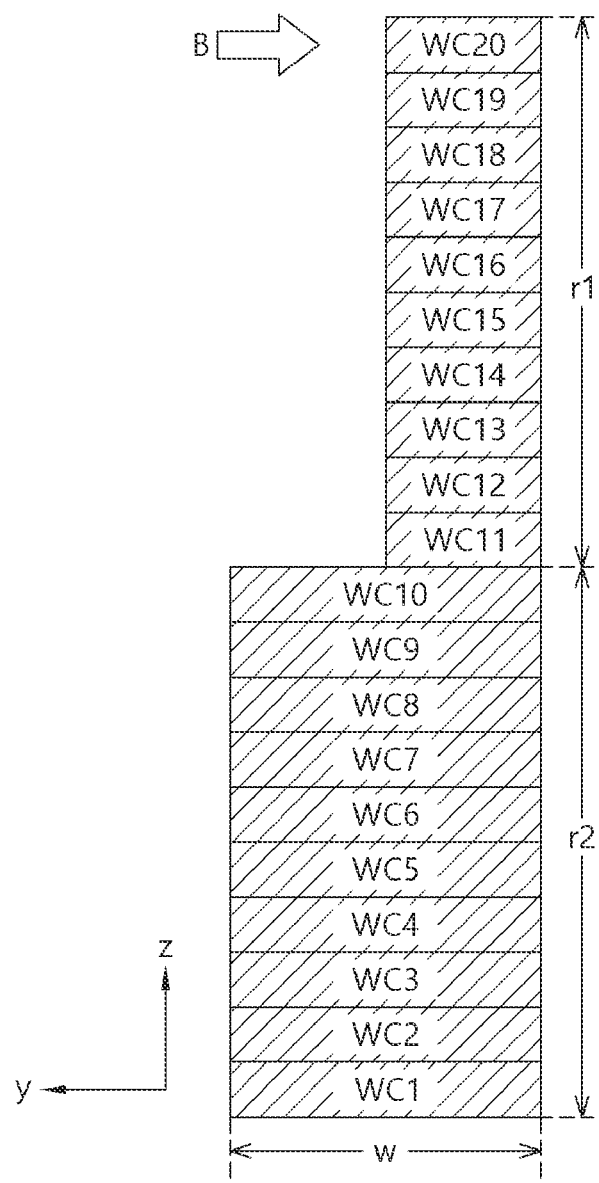
FIG. 10 is a cross-sectional view taken along a line XI-XI' in FIG. 9.

FIG. 9 is a perspective view illustrating a first line structure of a slimming region in accordance with example embodiments, and FIG. 10 is a cross-sectional view taken along a line XI-XI' in FIG. 9.

FIG. 9 shows word line contact regions WC1~WC20 of two adjacent memory blocks BLK before being divided into the memory blocks by a slit Sx.

Referring to FIGS. 9 and 10, word lines in the first line structure L1 may be divided into classes to control lengths and widths of the word lines. In example embodiments, the word line contact regions WC20~WC1 may have two stepped regions r1 and r2.

A method of forming the structure with the slimming region is disclosed in United States Patent Application Publication US 2020/0020714 A1, filed on Dec. 14, 2018, which is incorporated herein by reference in its entirety. Further, the slimming structure of the first line structure L1 in accordance with example embodiments should not be restricted to the above-indicated example embodiments.

Figure 11:
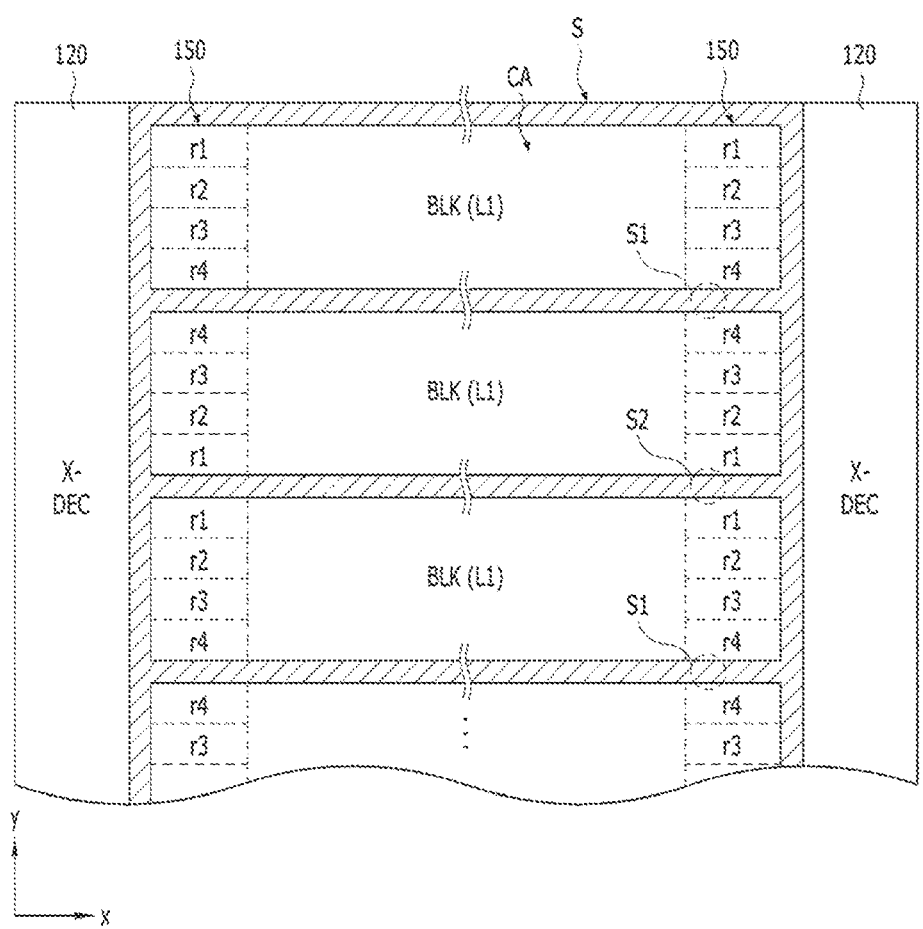
FIG. 11 is a plan view illustrating memory blocks of a semiconductor memory device in accordance with example embodiments.

FIG. 11 is a plan view illustrating memory blocks of a semiconductor memory device in accordance with example embodiments.

Referring to FIG. 11, the source selection line SSL, the word lines WL, and the drain selection line DSL in the first line structure L1 may be formed to have the step shape in the slimming region 150. Further the source selection line SSL, the word lines WL, and the drain selection line DSL may be divided into the memory blocks BLK by the slit S. The slit S may function to divide a sacrificial layer used for forming the first line structure L1, rather than a conductive layer in the first line structure L1. That is, the alternately stacked sacrificial layers and insulation layers may be divided into the memory blocks BLK by the slit S. The sacrificial layers may then be removed. A conductive layer may be formed in spaces formed by removing the sacrificial layers to form the first line structure L1 of the memory block BLK. In example embodiments, defining the first line structure L1 by the slit S may be interpreted as an inclusion of the above-indicated processes.

The memory block BLK may be divided into a cell array region CA and the slimming region 150. The slimming region 150 may be positioned between the cell array region CA and the row decoder 120. As shown in FIGS. 4 to 10, the slimming region 150 may have the first to fourth stepped regions r1, r2, r3, and r4 in the y-direction with the stepped portions in the x-direction. Further, in order to readily form the stepped regions r1, r2, r3, and r4, as shown in FIGS. 7 and 9, the stepped regions r1, r2, r3, and r4 of the slimming region 150 may be arranged symmetrically with the stepped regions r1, r2, r3, and r4 of the adjacent memory block BLK. Thus, in the slimming regions 150 of the adjacent memory block BLK, the relatively low stepped regions r4 or the relatively high stepped regions r1 may face each other.

As a result, the slit S in the slimming region 150 extending in the x-direction may have different heights. For example, a first slit S1 configured to divide the relatively low stepped region r4 may have a relatively low height. In contrast, a second slit S2 configured to divide the relatively high stepped region r1 may have a relatively high height. A height difference between the first slit S1 and the second slit S2 in the slimming region 150 may cause a leaning of the first slit S1 toward the memory block BLK. That is, a center of gravity of the slimming region 150 may lean toward the relatively high stepped region, for example, the first stepped region r1. Thus, the memory block BLK may be bent in the slimming region 150 due to the structural difference between the first slit S1 and the second slit S2. As shown in FIGS. 5, 8, and 10, a reference numeral to "B" may indicate a bending force of the memory block BLK. The bending of the memory block BLK may result in different sizes of the first slit S1 and the second slit S2. When a material may be formed in the first and second slits S1 and S2 to form the slit structure, the different sizes of the first and second slits S1 and S2 may cause non-uniformity of the slit structure and different sizes of seams in the slit structure to deteriorate electrical characteristics of the non-volatile memory device.

In example embodiments, in order to resolve the non-uniformity of the widths of the slits caused by the bending of the memory block BLK, shapes of the slits and the memory blocks may be changed.

Figure 12:
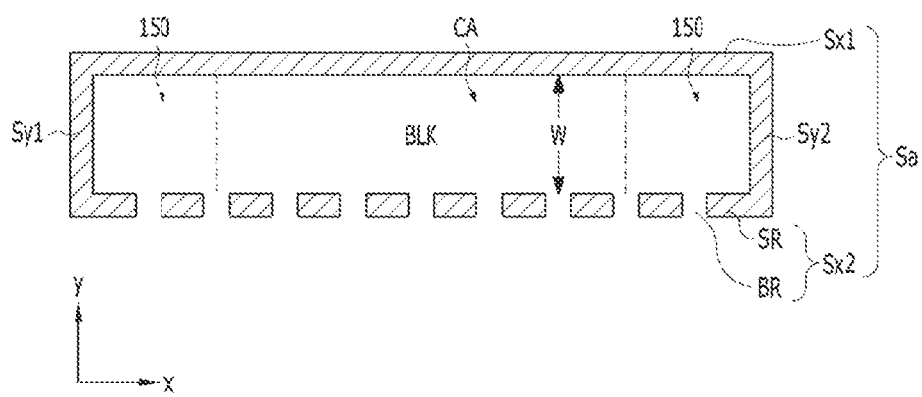
FIG. 12 is a plan view illustrating a slit structure for defining a memory block in accordance with example embodiments.

FIG. 12 is a plan view illustrating a slit structure for defining a memory block in accordance with example embodiments.

Referring to FIG. 12, a part of a slit structure Sa configured to define the memory block BLK may have a dashed shape.

For example, the slit structure Sa may include first and second slit portions Sx1 and Sx2 and third and fourth slit portions Sy1 and Sy2. The first and second slit portions Sx1 and Sx2 may extend parallel to each other in the x-direction, for example, an extending direction of the word line. The third and fourth slit portions Sy1 and Sy2 may extend parallel to each other in the y-direction, for example, an extending direction of the bit line. The first slit portion Sx1 and the second slit portion Sx2 may be spaced apart from each other by a gap substantially the same as a width of the memory block to BLK. The third slit portion Sy1 and the fourth slit portion Sy2 may be spaced apart from each other by a gap substantially the same as a length of the first line structure L1.

The first slit portion Sx1 may have a solid shape. The second slit portion Sx2 may have a dashed shape including a slit region SR and a bridge region BR. The slit region SR may correspond to a space configured to divide the memory block BLK. The slit region SR may have a length or a size for allowing an etchant, which may fully remove the sacrificial layers of the memory block BLK, therethrough.

As indicated above, positions of the source selection line, the word lines, and the drain selection line in the first line structure L1 may be determined by the sacrificial layer. Because the sacrificial layer may be removed by the etchant supplied through a sidewall of the slit region SR, the size of the slit region SR may be determined considering the removal of the sacrificial layer. Thus, a length or a size of the bridge region BR may be set in accordance with the length of the slit region SR. The solid first slit portion Sx1 may include only the slit region SR without the bridge region BR.

In example embodiments, the slit region SR may be an empty space before forming the first line structure L1. After forming the first line structure L1, the slit region SR may be filled with a filling material so that the slit region SR may be interpreted as the slit structure. Therefore, the slit, the slit structure, and the slit region may be interpreted as spaces or structures including insulating materials in accordance with corresponding states.

Further, the third and fourth slit portions Sy1 and Sy2 may divide a space between the slimming region 150 and the row decoder 120. Alternatively, the third and fourth slit portions Sy1 and Sy2 may include only the solid region without the bridge region BR.

As indicated above, the memory block BLK may be divided into the cell array region CA and the slimming region 150. The dash-shaped second slit portion Sx2 may be formed in the cell array region CA and the slimming region 150 or at least one of the cell array region CA and the slimming region 150.

Figure 13A:
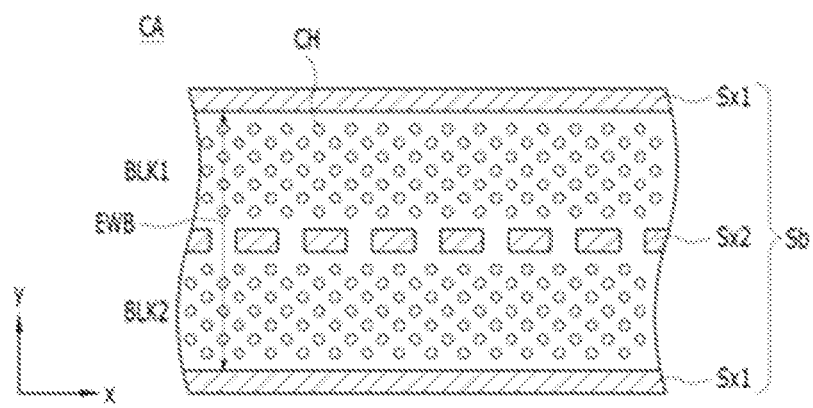
FIGS. 13A and 13B are plan views illustrating slit structures for dividing a cell array region of a memory block in accordance with example embodiments.
Figure 13B:
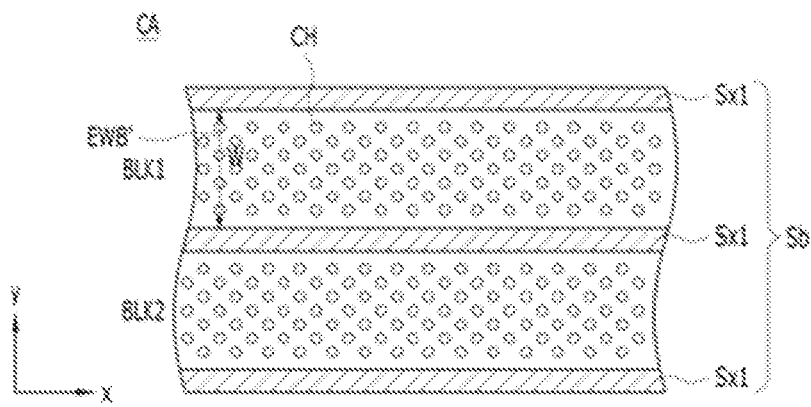
Figure 14A:
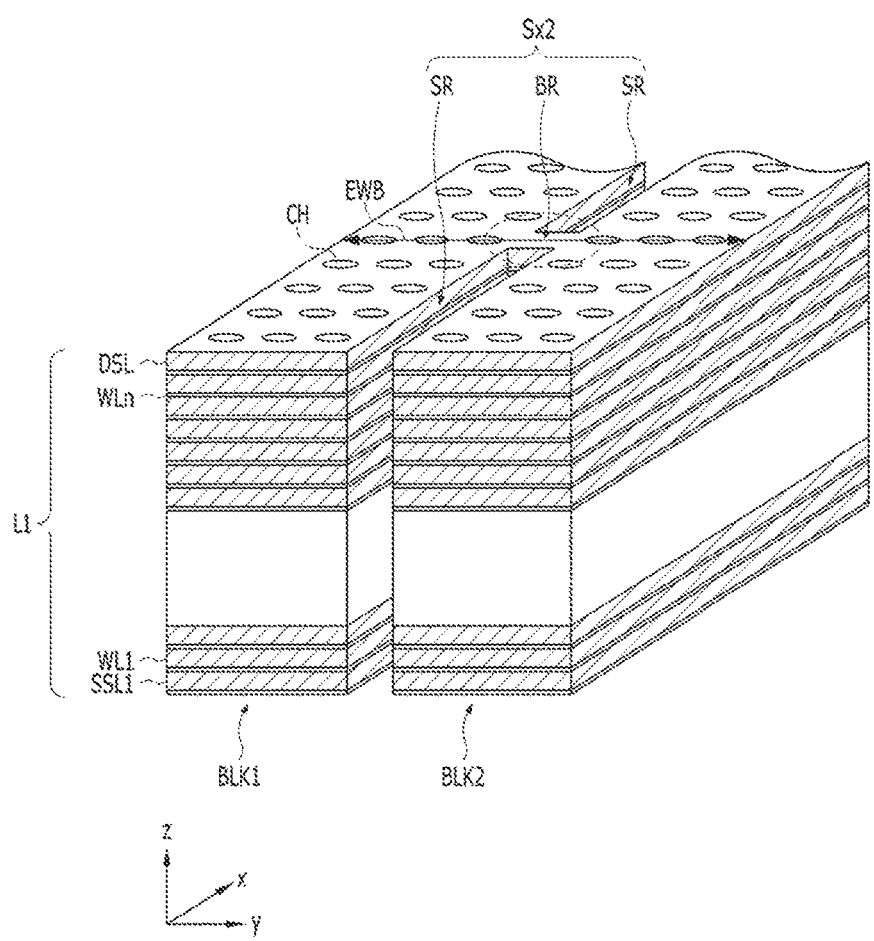
FIG. 14A is a perspective view illustrating the cell array region in FIG. 13A.
Figure 14B:
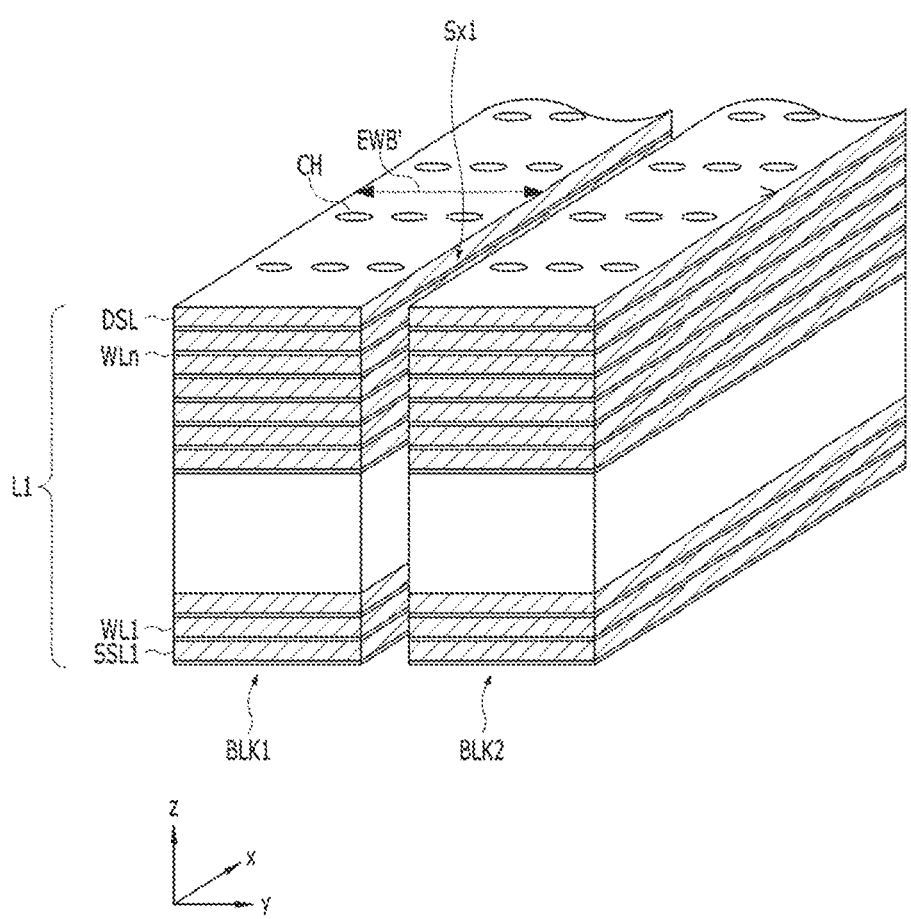
FIG. 14B is a perspective view illustrating the cell array region in FIG. 13B.

FIGS. 13A and 13B are plan views illustrating slit structures for dividing a cell array region of a memory block in accordance with example embodiments, FIG. 14A is a perspective view illustrating the cell array region in FIG. 13A, and FIG. 14B is a perspective view illustrating the cell array region in FIG. 13B.

Referring to FIGS. 13A and 13B, the cell array region CA of the memory block BLK may include a plurality of channel plugs CH and a plurality of supports. The channel plugs CH and the supports may be arranged in a uniform rule.

Each of the channel plugs CH may include a channel layer and a gate insulation layer. The channel layer may include a polysilicon layer, a single crystalline silicon layer, etc. At least part of the channel layer may be doped with conductive impurities. The channel layer may have a pillar shape vertically formed through the memory block BLK with respect to the substrate. Alternatively, the channel layer may have an opened tubular shape vertically formed through the substrate.

The gate insulation layer may be configured to surround an outer surface of the channel plug. The gate insulation layer may include a tunnel insulation layer, charge storage layer, and a blocking layer. The gate insulation layer may be interposed between the channel plug CH and the conductive layer in the first line structure L1.

The supports may be arranged between the channel plugs CH to fix the memory block BLK.

The cell array region CA may be divided into the memory blocks BLK by a slit structure Sb. The slit structure Sb may include a solid-shaped first slit portion Sx1 and a dash-shaped second slit portion Sx2. The first slit portion Sx1 and the second slit portion Sx2 may extend in the x-direction.

For example, as shown in FIG. 13A, the first slit portion Sx1, and the second slit portion Sx2 may be alternately arranged to define the cell array region CA of the memory block BLK. The second slit portion Sx2 may include at least one slit region SR and at least one bridge region BR.

As shown in FIG. 14A, the adjacent cell array regions CA along the y-direction may be partially and electrically connected by the bridge region BR and may be divided by the slit region SR. In other words, the first line structures L1 of the first and second memory blocks BLK1 and BLK2 may be electrically connected with each other by the bridge region BR. Thus, an effective width EWB of the first memory block BLK1 and/or the second memory block BLK2 may be increased by about two times the width w of the original memory block BLK by the bridge region BR. As a result, the memory block BLK may have an improved aspect ratio to prevent or mitigate the bending of the memory block BLK, thereby obtaining the uniform slit structure Sb.

Alternatively, as shown in FIG. 13B, the cell array region CA of the memory block BLK may be defined by only the solid-shaped first slit portion Sx1.

When the cell array region CA includes only the solid first slit portion Sx1, as shown in FIG. 14B, the memory blocks BLK1 and BLK2 may be completely divided not using the bridge region. Thus, an effective width EWB' of the cell array region CA may be substantially the same the width w of the memory blocks BLK1 and BLK2.

Figure 15:
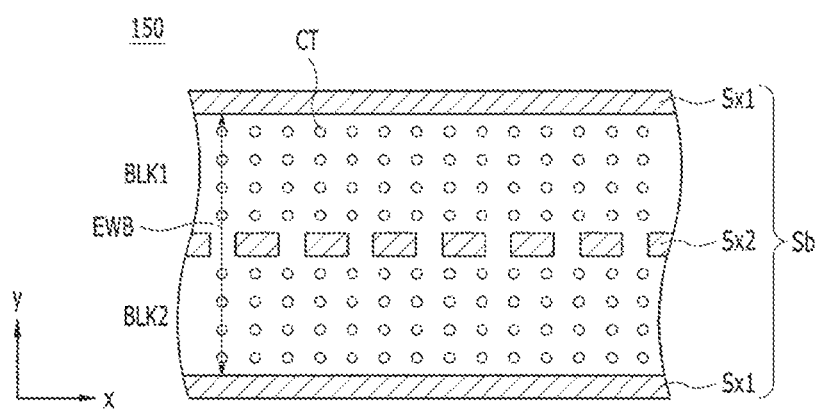
FIG. 15 is a plan view illustrating a slit structure for dividing a slimming region of a memory block in accordance with example embodiments.
Figure 16:
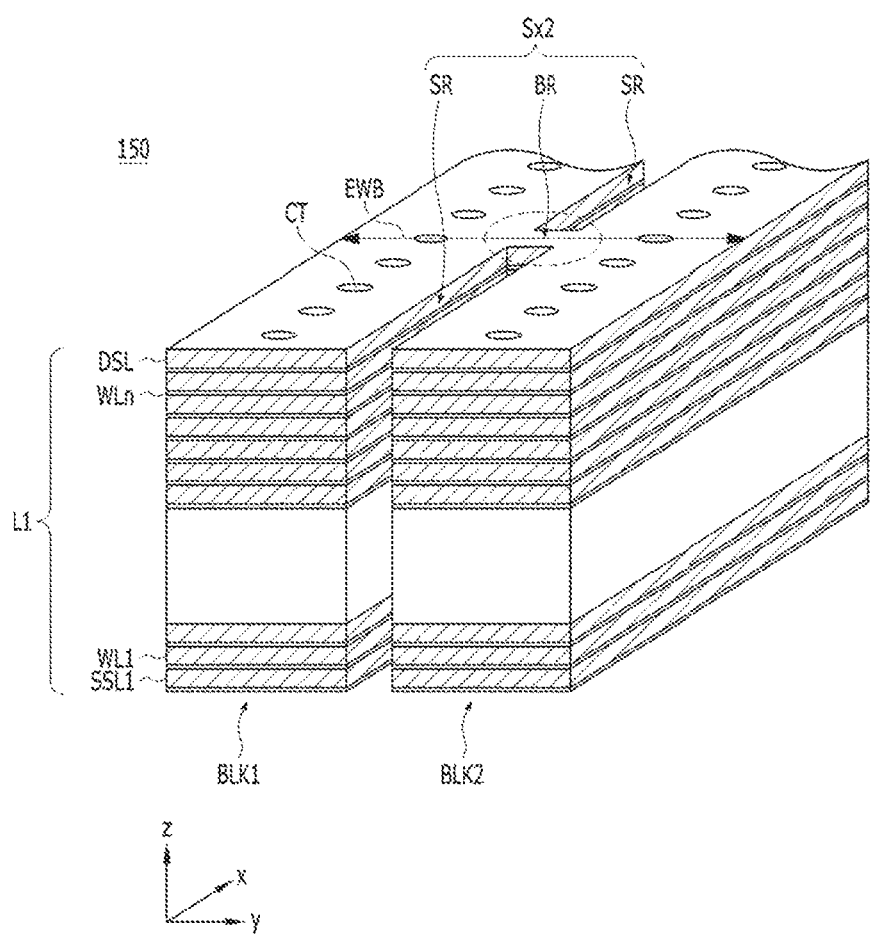
FIG. 16 is a perspective view illustrating the slimming region in FIG. 15.

FIG. 15 is a plan view illustrating a slit structure for dividing a slimming region of a memory block in accordance with example embodiments, and FIG. 16 is a perspective view illustrating the slimming region in FIG. 15.

Referring to FIGS. 15 and 16, the slimming region 150 may include a plurality of contact structures CT. The contact structures CT may be arranged in a uniform rule to supply an operational voltage to the conductive lines of the first line structure L1. For convenience of explanation, FIGS. 15 and 16 show a part of the contact structures CT. For example, each of the contact structures CT may be electrically connected to the contact regions WC1~WC36 in FIGS. 4 to 10.

The slimming region 150 may be divided by a slit structure Sb to define the memory block BLK. In order to divide the slimming region 150 of the adjacent memory block BLK in the y-direction into memory block units, a solid first slit portion Sx1 and a dashed second slit portion Sx2 may be alternately arranged. Thus, as shown in FIG. 16, a bridge region BR may be partially generated in the slimming region 150 of the memory block BLK divided by the second slit portion Sx2. The first line structures L1 may be partially connected between the slimming regions 150 of the adjacent memory block BLK by the bridge region BR.

Therefore, an effective width EWB of the memory block BLK may be increased by the bridge region BR generated in the slimming region 150. As a result, the memory block BLK may have an improved aspect ratio.

Figure 17:
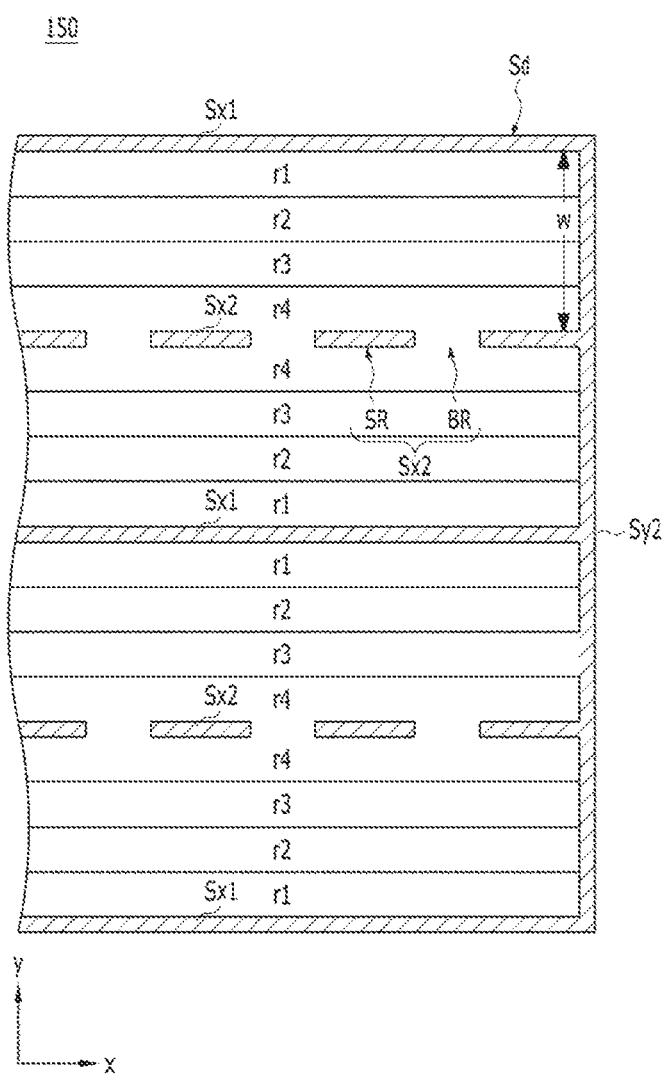
FIG. 17 is a plan view illustrating a slit structure for dividing a slimming region of a memory block in accordance with example embodiments.
Figure 18:
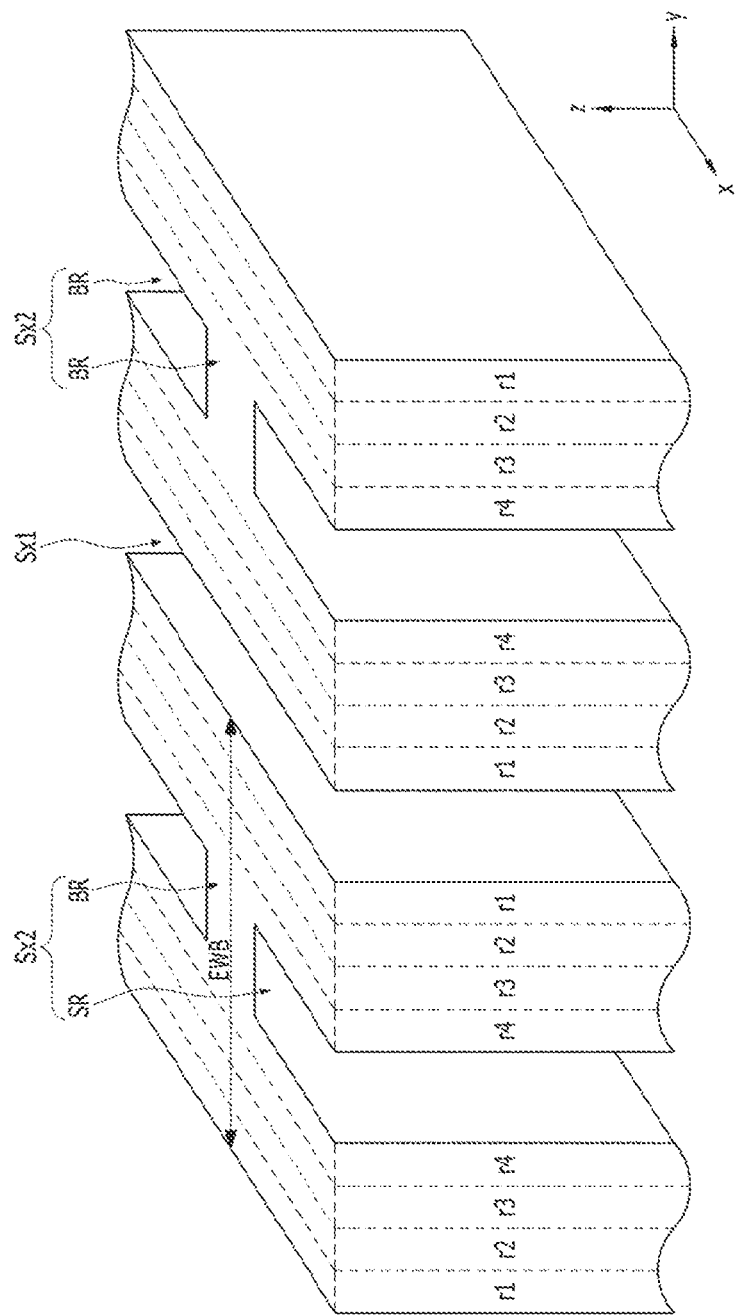
FIG. 18 is a perspective view illustrating the slimming region in FIG. 17.

FIG. 17 is a plan view illustrating a slit structure for dividing a slimming region of a memory block in accordance with example embodiments, and FIG. 18 is a perspective view illustrating the slimming region in FIG. 17.

Referring to FIGS. 17 and 18, the slimming region 150 may be divided into the memory blocks BLK by a slit structure Sd.

The slimming region 150 may include the stepped regions r1, r2, r3, and r4 extending in the x-direction as well as the y-direction for ensuring a plurality of contact regions. Further, as indicated above, for convenience of formation, the stepped regions r1, r2, r3, and r4 in the slimming region 150 may be arranged symmetrically with the adjacent stepped regions r1, r2, r3, and r4 in the slimming region 150 in the y-direction. The stepped regions r1, r2, r3, and r4 may have gradually increasing heights from the stepped region r1 to the stepped region r4.

The slit structure Sd may include a first slit portion Sx1 and a second slit portion Sx2 alternately arranged. The slit structure Sd may further include a third slit portion Sy1 and a fourth slit portion Sy2 extending in the y-direction. The first slit portion Sx1, the third slit portion Sy1, and the fourth slit portion Sy2 may have a solid shape. The second slit portion Sx2 may include at least one slit region SR and at least one bridge region BR.

In example embodiments, the first slit portion Sx1 may be positioned between the first stepped regions r1. The second slit portion Sx2 may be positioned between the fourth stepped regions r4.

In example embodiments, because the fourth stepped region r4 having the relatively low step may be divided by the dashed second slit portion Sx2, the bridge region BR may be generated between the slimming regions 150 of the adjacent memory block BLK.

Because the bridge region BR of the first line structure L1 may be formed between the slimming regions 150 of the memory blocks BLK facing to each other, the memory block BLK may be firmly fixed without the bending. Further, an effective width EWB of the slimming region 150 of the memory block BLK may be increased by the bridge region BR. Thus, the aspect ratio of the memory block BLK may be improved to prevent or mitigate the bending of the memory block BLK.

Figure 19:
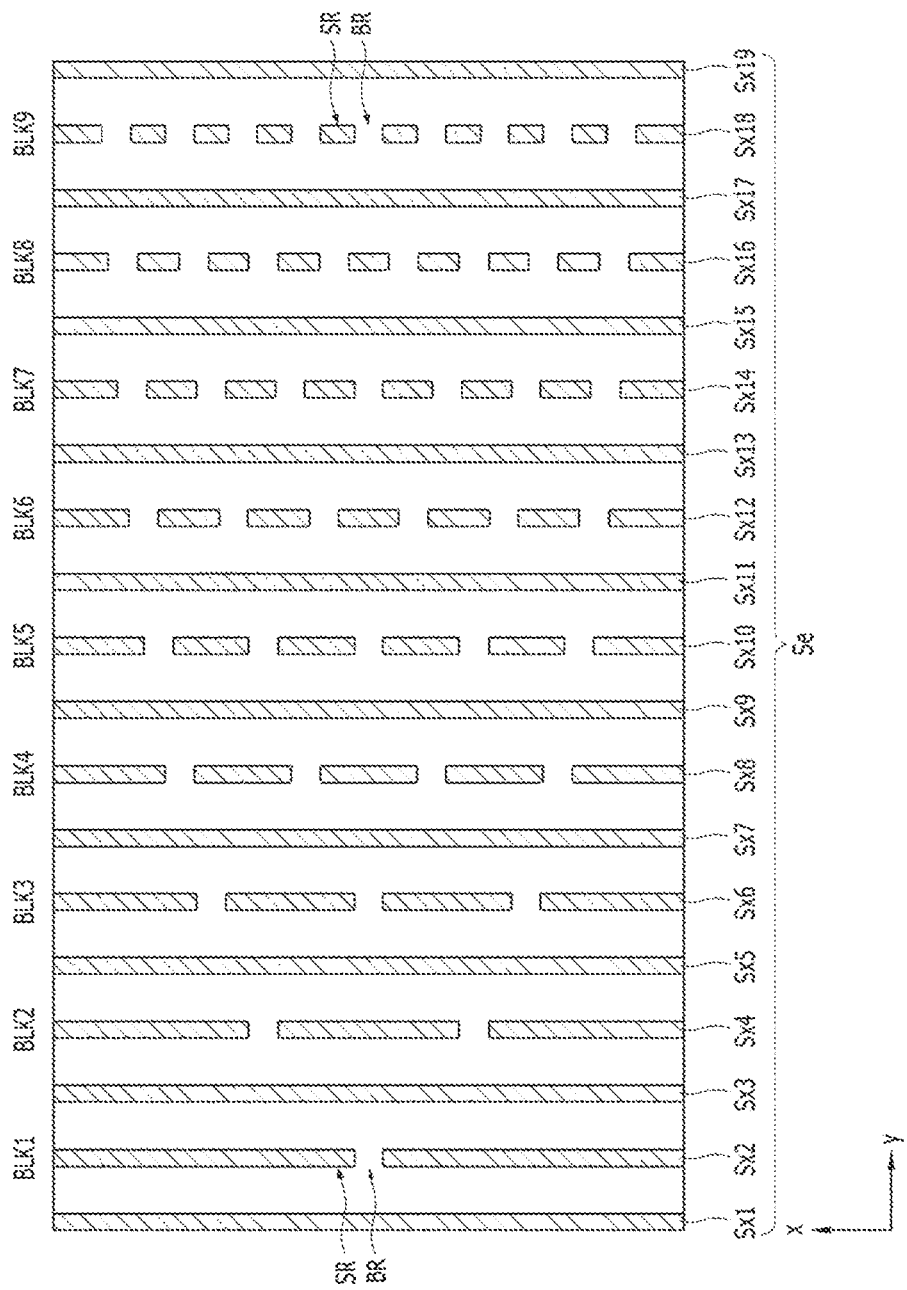
FIG. 19 is a plan view illustrating a plurality of memory blocks in accordance with example embodiments.

FIG. 19 is a plan view illustrating a plurality of memory blocks in accordance with example embodiments.

Referring to FIG. 19, in order to divide the memory blocks BLK1~BLK9 of the semiconductor memory device along the y-direction, for example, the extending direction of the bit line, a slit Se may include a plurality of solid slit portions Sx1, Sx3, Sx5, and a plurality of dashed slit portions Sx2, Sx4, Sx6.

In example embodiments, the solid slit portions Sx1, Sx3, Sx5, and the dashed slit portions Sx2, Sx4, Sx6, may be alternately arranged. Further, the dashed slit portions Sx2, Sx4, Sx6, may include different numbers of bridge regions BR. The dashed slit portions Sx2, Sx4, Sx6, may be configured to divide a relatively low stepped region of the memory block BLK.

For example, the first dashed slit portion Sx2 may have one bridge region BR. The second dashed slit portion Sx4 may have two bridge regions BR. Thus, an nth dashed slit portion Sx2n may have n numbers of bridge regions BR. The numbers of lengths of the bridge region BR may be set within the removal of the sacrificial layers by the etchant provided through the slit region SR.

In example embodiments, the bridge regions BR may have a sequentially increasing shape. However, the bridge regions BR may be randomly arranged.

Further, the memory blocks BLK1~BLK9 in FIG. 19 may correspond to the cell array region CA or the slimming region 150.

According to example embodiments, the slit region SR and the bridge region BR may have the various shapes so that the memory block BLK having the high aspect ratio may be firmly fixed without the bending.

When a part of the slit configured to divide the memory block may include the dash shape, the slit on a wafer may have a uniform width.

In example embodiments, the lines in the first line structure L1, the word lines and the sacrificial layer may have substantially the same shape. Although these may be illustrated mixed with each other, these may indicate the same structure.

Further, the contact regions, for example, the word line contact region of the lines in the first line structure L1 may have various structures, not restricted within the structures in FIGS. 4 to 10.

Figure 20:
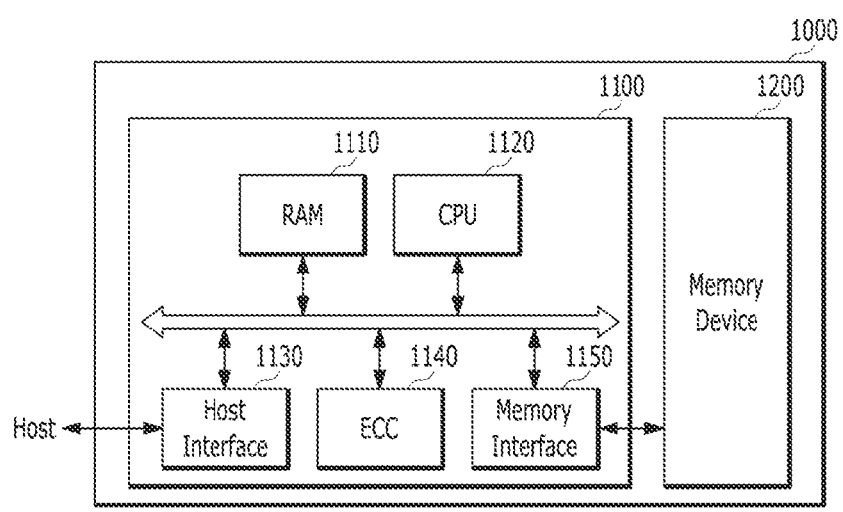
FIG. 20 is a block diagram illustrating a memory system in accordance with example embodiments.

FIG. 20 is a block diagram of a configuration of a memory system 1000 according to an embodiment of the present disclosure.

As illustrated in FIG. 20, the memory system 1000 may include a memory device 1200 and a controller 1100.

The memory device 1200 may be used to store various data types such as text, graphic, and software code. The memory device 1200 may be a non-volatile memory. The memory device 1200 may be the semiconductor device described above with reference to FIGS. 1 to 19

The controller 1100 may be couple to a host and the memory device 1200 and may access the memory device 1200 in response to a request from the host. For example, the controller 1100 may control read, write, erase, and background operations of the memory device 1200.

The controller 1100 may include random access memory (RAM) 1110, a central processing unit (CPU) 1120, a host interface 1130, an error correction code (ECC) circuit 1140, and a memory interface 1150.

The RAM 1110 may function as operation memory of the CPU 1120, a cache memory between the memory device 1200 and the host, and a buffer memory between the memory device 1200 and the host. The RAM 1110 may be replaced by static random access memory (SRAM) or read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, because the memory system 1000 according to an embodiment of the present disclosure may be reliably manufactured and includes the memory device 1200 having a stable structure and improved characteristics, the characteristics of the memory system 1000 may also be improved.

Figure 21:
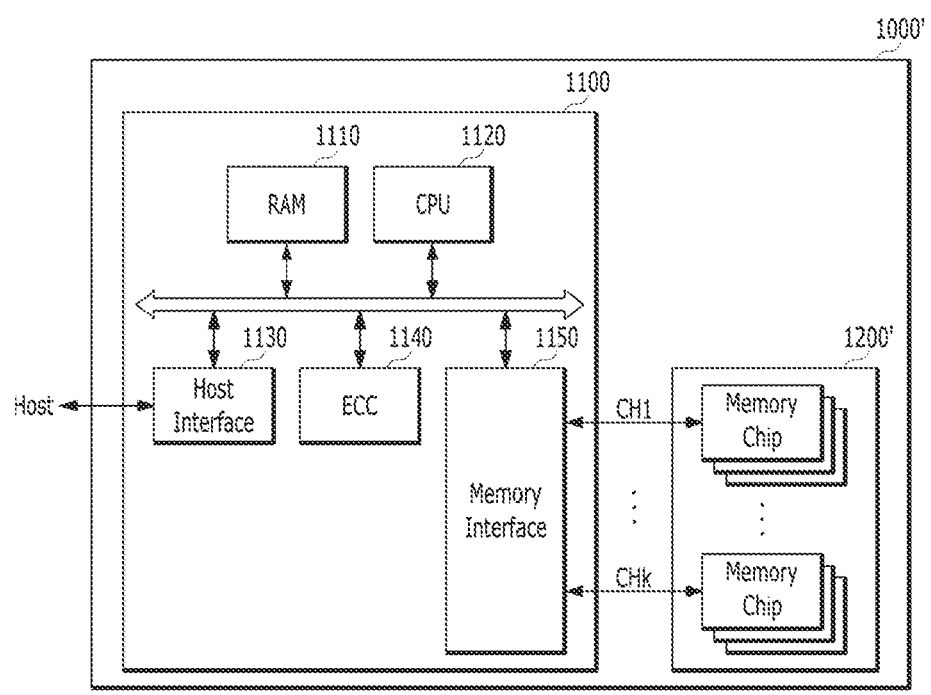
FIG. 21 is a block diagram illustrating a memory system in accordance with example embodiments.

FIG. 21 is a block diagram of a configuration of a memory system 1000' according to an embodiment of the present disclosure. Hereinafter, a description of common contents with the earlier described embodiment is omitted.

As illustrated in FIG. 21, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device. The memory device 1200' may be the semiconductor device described above with reference to FIGS. 1 to 19. Because the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, because the memory system 1000' according to an embodiment of the present disclosure may be reliably manufactured and includes the memory device 1200' having a stable structure and improved characteristics, the characteristics of the memory system 1000' may also be improved. In addition, the data storage capacity of the memory system 1000' may be further increased by forming the memory device 1200' using a multi-chip package.

Figure 22:
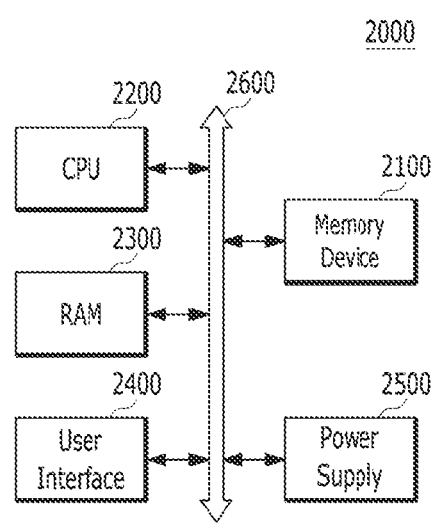
FIG. 22 is a block diagram illustrating a computing system in accordance with example embodiments.

FIG. 22 is a block diagram of a configuration of a computing system 2000 according to an embodiment of the present disclosure. Hereinafter, a description of common contents with the earlier described embodiments is omitted.

As illustrated in FIG. 22, the computing system 2000 may include a memory device 2100, a CPU 2200, random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 1 to 19. In addition, as described above with reference to FIG. 21, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, because the computing system 2000 according to an embodiment of the present disclosure may be reliably manufactured and includes a memory device 2100 having a stable structure and improved characteristics, the characteristics of the computing system 2000 may also be improved.

Figure 23:
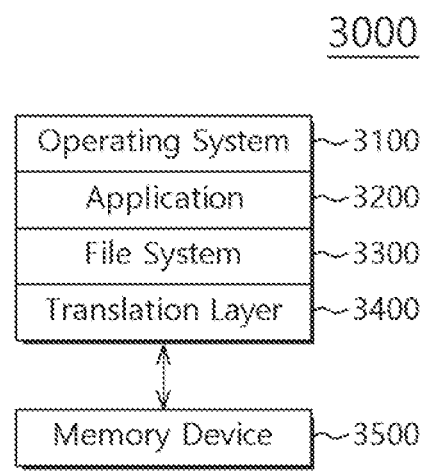
FIG. 23 is a block diagram illustrating a computing system in accordance with example embodiments.

FIG. 23 is a block diagram of a computing system 3000 according to an embodiment of the present disclosure.

As illustrated in FIG. 23, the computing system 3000 may include a software layer that has an operating system 3100, an application 3200, a file system 3300, and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

FIG. 23 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 to may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device described above with reference to FIGS. 1 to 19. The computing system 3000 having the above-described configuration may be divided into an operating system layer that is operated in an upper level region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A semiconductor memory device comprising:
   a stack structure including a plurality of insulation layers and a plurality of conductive layers alternately stacked with the plurality of insulation layers; and
   a slit structure configured to divide the stack structure into a plurality of memory blocks,
   wherein the slit structure includes at least one long slit portion extending along a first direction and at least one short slit portion extending along a second direction, the at least one short slit portion is shorter than the long slit portion, and the at least one long slit portion has a dashed shape including at least one slit region and at least one bridge region.

2. The semiconductor memory device of claim 1, wherein each of the memory block comprises a line structure including a source selection line, a plurality of word lines, and a drain selection line.

3. The semiconductor memory device of claim 1,
   wherein the long slit portion includes a first slit portion and a second slit portion, and at least one of the first and second slit portions has the dashed type, and
   wherein the first direction is perpendicular to the second direction.

4. The semiconductor memory device of claim 3,
   wherein each of the memory blocks includes a cell array region and at least one sliming region adjacent to the cell array region,
   wherein the cell array region and the sliming region include at least one selection line, a plurality of word lines and at least one drain selection line which are sequentially stacked, respectively, and
   wherein the at least one selection line, the plurality of word lines and the at least one drain selection line of the sliming region have different lengths or different widths to generate stepped regions in end portions of the slimming region.

5. The semiconductor memory device of claim 4,
   wherein the the slimming region comprises a high stepped region formed in one sidewall of the slimming region and a low stepped region formed in an other sidewall of the slimming region, the one sidewall and the other sidewall of the slimming region extend along the first direction, and
   wherein the high stepped regions of adjacent memory blocks face each other with the first slit portion interposed therebetween, or the low stepped regions of adjacent memory blocks face each other with the second slit portion interposed therebetween.

6. The semiconductor memory device of claim 5, wherein the second slit portion has the dashed shape.

7. The semiconductor memory device of claim 3,
   wherein the short slit portion includes a third slit portion and a fourth slit portion which are parallel each other, the third slit is positioned between one ends of the first and second slit portions and the fourth slit is positioned between other ends of the first and second slit portions.

8. The semiconductor memory device of claim 1, wherein each of the memory block includes a cell array region and at least one slimming region adjacent to the cell array region, and
wherein the slimming region is configured to receive electrical signals to be provided to the cell array region.

9. The semiconductor memory device of claim 1, wherein the second direction is perpendicular to the first direction.

10. A semiconductor memory device comprising:
a slit structure configured to divide a plurality of memory blocks,
wherein the slit structure comprises first and second slit portions alternately arranged and extending parallel to each other in a first direction, and third and fourth slit portions extending parallel to each other in a second direction perpendicular to the first direction, the third slit portion configured to connect first ends of the first and second slit portions with each other, and the fourth slit portion configured to connect second ends of the first and second slit portions with each other,
wherein the first slit portion comprises a slit region, and
wherein the second slit portion has a dashed shape including the slit region and at least one bridge region.

11. The semiconductor memory device of claim 10, wherein a plurality of the second slit portions comprises different numbers of the bridge regions.

12. The semiconductor memory device of claim 10, wherein the bridge regions of different second slit portions have different sizes.

13. The semiconductor memory device of claim 10, wherein each of the plurality of memory blocks comprises a line structure,
wherein a line structure of a selected memory block of the plurality of memory blocks is electrically connected, through at least one bridge region, with a line structure of a memory block of the plurality of memory blocks adjacent to the selected memory block.

14. The semiconductor memory device of claim 13, wherein the selected memory block comprises a cell array region and a slimming region arranged between the cell array region and the third slit portion and between the cell array region and the fourth slit portion, and
wherein the bridge region of the second slit portion is positioned in at least one of the cell array region and the slimming region.

15. The semiconductor memory device of claim 14, wherein the line structure in the slimming region of the selected memory block comprises a plurality of contact regions configured to make contact with an electrical signal line,
wherein the line structure in the slimming region of the selected memory block is divided into high stepped regions and low stepped regions extending in the first and second directions with respect to the second direction to expose the contact regions, and
wherein the first slit portion is positioned between high stepped regions and the second slit portion is positioned between low stepped regions.

* * * * *